US009472921B2

United States Patent
Brownlee et al.

(10) Patent No.: US 9,472,921 B2
(45) Date of Patent: Oct. 18, 2016

(54) SPLIT VOLTAGE SUPPLY CONFIGURATION WITH MATCHED INPUT LOAD FOR SINGLE ENDED DRIVERS

(71) Applicant: Mindspeed Technologies, Inc., Newport Beach, CA (US)

(72) Inventors: Merrick Brownlee, Hillsboro, OR (US); Atul Gupta, Aliso Viejo, CA (US); Vasilis Papanikolaou, Toronto (CA)

(73) Assignee: Macom Technology Solutions Holdings, Inc., Lowell, MA (US)

( * ) Notice: Subject to any disclaimer, the term of this patent is extended or adjusted under 35 U.S.C. 154(b) by 28 days.

(21) Appl. No.: 14/599,404

(22) Filed: Jan. 16, 2015

(65) Prior Publication Data

US 2016/0211638 A1    Jul. 21, 2016

(51) Int. Cl.
| | | |
|---|---|---|
| H01S 3/00 | (2006.01) | |
| H01S 3/0975 | (2006.01) | |
| H01S 3/09 | (2006.01) | |
| H01S 5/042 | (2006.01) | |
| H01S 5/062 | (2006.01) | |
| H01S 3/097 | (2006.01) | |
| H01S 5/026 | (2006.01) | |

(52) U.S. Cl.
CPC .............. *H01S 3/0975* (2013.01); *H01S 3/09* (2013.01); *H01S 3/09702* (2013.01); *H01S 5/0261* (2013.01); *H01S 5/042* (2013.01); *H01S 5/06203* (2013.01)

(58) Field of Classification Search
CPC .............. H01S 3/0975; H01S 5/0261; H01S 3/09702; H01S 5/06203; H01S 5/042; H01S 3/09
See application file for complete search history.

(56) References Cited

U.S. PATENT DOCUMENTS

| | | | |
|---|---|---|---|
| 7,145,928 B1 * | 12/2006 | Maxim ................. | G02F 1/0123 |
| | | | 372/38.01 |
| 7,269,194 B2 | 9/2007 | Diaz et al. | |
| 2009/0268767 A1 * | 10/2009 | Nelson .................. | H03K 17/16 |
| | | | 372/38.02 |
| 2012/0201260 A1 | 8/2012 | Nguyen et al. | |

FOREIGN PATENT DOCUMENTS

JP      EP 2249492 A1 * 11/2010 ........... G02F 1/0123

OTHER PUBLICATIONS

Single-Ended vs. Differential Methods of Driving a Laser Diode, Maxim Integrated™, Application Note: HFAN-2.5.0, Rev. 5; Oct. 2008, 5 pages.
Miller Effect—Wikipedia, the free encyclopedia, http://en.wikipedia.org/wiki/Miller_effect, Mar. 9, 2015.

* cited by examiner

*Primary Examiner* — Yuanda Zhang
(74) *Attorney, Agent, or Firm* — Weide & Miller, Ltd.

(57) ABSTRACT

An optical transmitter driver is disclosed to drive a load with a drive signal responsive to a first and second input signal. The differential pair includes a first path having a first resistor connected to a first voltage supply and to a first transistor that receives the first input signal. A second path includes a second resistor connected to a second voltage supply and a second transistor. The first voltage supply is less than the second voltage supply. The second transistor has an input configured to receive the second input signal and the first and second input signals define a differential signal. Also part of this embodiment is a load connection node that presents the drive signal to the load. The first voltage supply is less than the second voltage supply. In one configuration cross coupled capacitor are connect between each input and the first path and second path.

14 Claims, 9 Drawing Sheets though numerous different systems which have a driver circuit may benefit from the improved driver circuit disclosed herein, optical transmitters and related systems are discussed below in detail.

SPLIT VOLTAGE SUPPLY CONFIGURATION WITH MATCHED INPUT LOAD FOR SINGLE ENDED DRIVERS

FIELD OF THE INVENTION

This innovation relates to driver circuits and in particular to a single ended driver circuit using different supply voltages while maintaining a matched input impedance.

RELATED ART

Numerous electronic devices utilize a driver to amplify a data signal to a magnitude (voltage and current) sufficient to power another element in the electronic device, such as an optical signal generator, transmitter, or audio device. Although numerous different systems which have a driver circuit may benefit from the improved driver circuit disclosed herein, optical transmitters and related systems are discussed below in detail.

In many high speed digital communications systems, driving the optical transmitter, such as a laser diode or laser modulator, is the primary power consuming function. The optical transmitter device requires the driver to source large currents while simultaneously maintaining sufficient voltage headroom for the driver to avoid clipping or distortion. Hence, the optical signal generator requires high current and high voltage, relative to the environment of use. Consequently, these factors demand a large supply voltage.

Design of optical transmitter driver is further complicated by the requirement that the output signal often must be single ended, while signals in the buffer chain leading to the final driver stage are almost always differential. In fact, the majority of optical signal generators are single ended.

FIG. 1 illustrates an exemplary prior art driver circuit. Shown in FIG. 1 is a data input 116 carrying a data signal that is presented to a pre-driver circuit 104. The data signal may be a differential signal on data input 104. The output of the pre-driver circuit is a differential signal which is provided to a driver circuit 108. The output of the driver circuit 108 connects to a load 112. As shown, the load is single ended, and accordingly the output of the driver circuit 108 is single ended. The load is represented as a resistive and capacitive element, but could comprise any device or function.

In operation, the pre-driver circuit 104 performs pre-amplification of the data signal on input(s) 116 before passing the data signal to the driver circuit 108. The driver circuit 108 amplifies the received signal to a magnitude, which has sufficient headroom and current sourcing capacity, to drive the load 112. The load 112 may be static or dynamic.

The driver circuit 108 includes a differential pair configuration including a two transistors 120p and 120n which connect to common supply voltage VCC through collector resistors 124 as shown. The emitter of the transistors 120p, 120n connect to a common emitter node 130, which in turn connects to an active device, such as a FET type transistor 134, the opposing terminal of which connects to a ground node 138. This may be referred to as a differential pair tail or tail configuration with active element 134.

The differential input to the driver circuit 108 from the pre-driver 104 is presented as a positive input, Vpre,p input at the base node of transistor 120p and as a negative side of the differential input to Vpre,n at the base node of transistor 120n. Both transistors are biased by the common supply voltage VCC.

This configuration suffers from excessive power consumption because even though only the negative side (right side) of the differential pair is driving the load, both the negative and positive side (right and left side) are consuming bias current based on VCC. There is a potential to save power by driving the laser differentially, but that requires the laser itself to be designed to be driven differentially, which is uncommon and introduces other drawbacks. Most available lasers are not intended to be driven differentially as the majority of the lasers have larger loading at one of the terminals which is intended to be used as a common terminal.

Therefore, there is a need in the art for a driver circuit which consumes less power while still maintaining high frequency operation for single ended loads.

SUMMARY

This innovation drastically reduces power by separating the supplies of the two sides of the final differential pair and using a lower voltage on the "unused" side; that is, the side that does not drive the external optical transmitter. A downside of this scheme is that the load that the final stage of the driver presents to the previous stage (i.e., the pre-driver), becomes asymmetric which reduces the signal quality. This innovation describes an asymmetric cross-coupled capacitor feedback scheme which reduces and balances the differential capacitive load. The reduced and balanced capacitive load, in turn, improves signal quality and reduces the power required in the pre-driver stage.

To overcome the drawbacks of the prior art and provide additional benefits, disclosed as one exemplary embodiment is an optical transmitter driver that includes a differential pair configured to drive a load with a drive signal responsive to a first input signal and a second input signal. In this embodiment, the differential pair includes a first path having a first resistor connected to a first voltage supply and a first transistor. The first transistor has an input configured to receive the first input signal. Also part of the differential pair is a second path having a second resistor connected to a second voltage supply and a second transistor. In this embodiment, the second transistor has an input configured to receive the second input signal and the first input signal and the second input signal define a differential signal. A load connection node is established between the second resistor and the second transistor such that the load connection node presenting the drive signal to the load, wherein the first voltage supply is less than the second voltage supply.

In one embodiment the load comprises an optical transmitter having a single ended input configured to generate an optical signal responsive to the first input signal and second input signal. In one configuration, the driver further comprising a differential pair tail having an active element such that the differential pair tail is connected between the first transistor, the second transistor and a ground node. In one configuration, the first voltage supply is equal to or less than 50% of the second voltage supply. In one embodiment, the resistance of the first resistor is not equal to the resistance of the second resistor.

It is further contemplated that a first capacitor may be connected between the first transistor input and the load connection node and that a second capacitor may be connected between the second transistor input and a node established between the first resistor and the first transistor. The first capacitor may have a different capacitance value than the second capacitor.

Also disclosed herein is a driver configured to drive a load with a drive signal. The driver generates the drive signal in response to a first input signal and a second input signal. In this embodiment, the driver includes a first active device connected to a first voltage supply node. The first active device has an input configured to receive the first input signal. Also part of the driver is a second active device connected to a second voltage supply node. The second active device has an input configured to receive the second input signal. The first input signal and the second input signal define a differential signal. A load connection node is provided between the second voltage supply and the second active device. The load connection node presents the drive signal to the load, such that a voltage on the first voltage supply node is less than a voltage on the second voltage supply node.

In one embodiment, the first active device and second active device comprise transistor configured as a differential pair. Also disclosed as being part of this embodiment is a first resistor located between the first active device and the first supply voltage node and a second resistor located between the second active device and the second supply voltage node. The first resistor may be configured with a different value than the second resistor.

Also part of this embodiment may be a first impedance matching device connected between the first active device input and the load connection node and a second impedance matching device connected between the second transistor input and the first supply voltage node. The first impedance matching device may have a different value than the second impedance matching device. In one configuration, the driver also includes a third active device connected to both of the first active device and the second active device and to ground, the third active device configured as a current source tail.

Also disclosed herein is a method for reducing power consumption in a driver when driving an optical transmitter. To enable this method, a differential pair is provided having a first path, which includes a first resistor and a first transistor, and a second path, which includes a second resistor and a second transistor. Also, provided is a first supply voltage to the first path and a second supply voltage to the second path, the first supply voltage lower than the second supply voltage thereby reducing power consumption. The method receives a differential signal, in the form of a first input signal and a second input signal, at a differential pair first input and a differential pair second input respectively. The differential pair amplifies the first input signal and a second input signal with the current minor to create a singled ended drive signal. The drive signal is then presented to a load on to a differential pair output node that is located on the second path.

In one embodiment, the load is an optical transmitter. In one configuration, the first path has the first resistor connected in series to the first supply voltage and the first transistor and the second path has the second resistor connected in series to the second supply voltage and the second transistor. The driver that enables this method may further have a first capacitor between the differential pair first input and the second path and connecting a second capacitor between the differential pair second input and the second path and providing feedback between the first path and the second path through the first capacitor and the second capacitor. It is contemplated that the value of the first resistor may be different than a value of the second resistor.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

Figure 2:
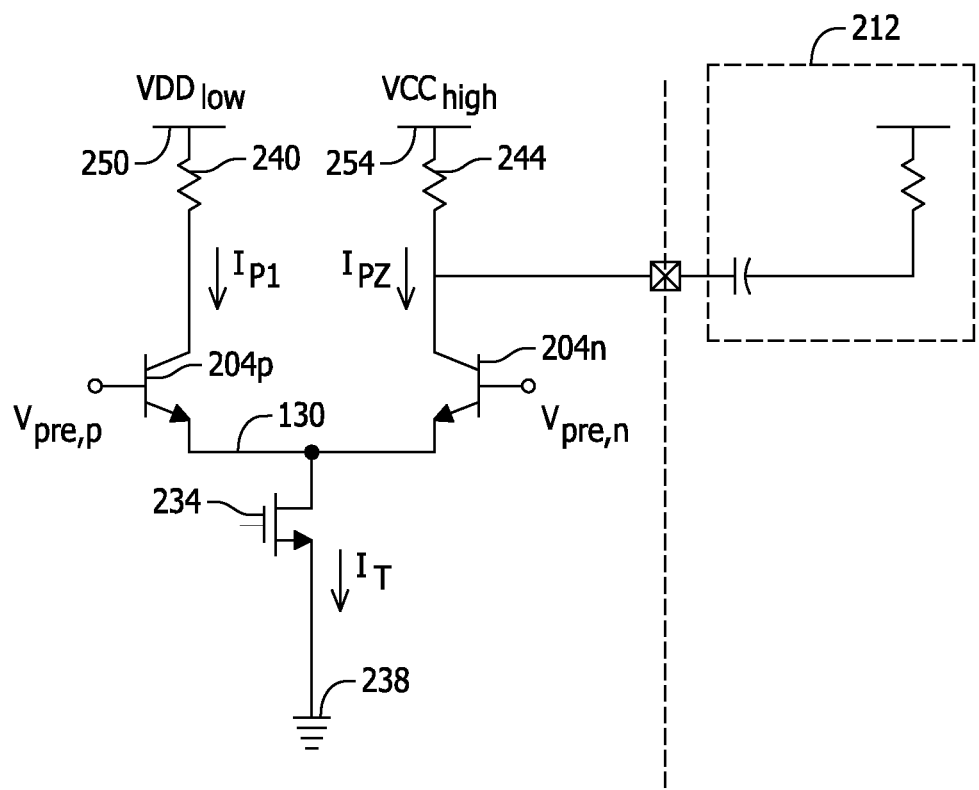
FIG. 2 illustrates a first embodiment of a driver circuit with separate supply voltages.

FIG. 2 illustrates a first embodiment of a driver circuit with separate supply voltages. This is but one possible circuit configuration and it is understood that one of ordinary skill in the art will arrive at alternative configurations. As shown, a first transistor 204p and a second transistor 204n are presented in a differential pair configuration and define a first path and a second path. The first path is defined as the path through the first resistor 240 and the first transistor 204p. The second path is defined as the path through the second resistor 244 and the second transistor 204n.

In one configuration the differential pair may be defined as a CML (current mode logic) with a tail current source. When the differential pair is configured as a CML (current mode logic) the tail current is switched from left side to right side.

The tail current source may be considered for purposes of discussion or implementation as an ideal current source and can be implemented in numerous different ways. The collector node of each transistor 204p, 204n connects to a FET 234 or other active device. The FET 234 may be referred to as a tail current source, through which a tail current $I_T$ flows. The FET 234 is configured to set a current $I_T$ that flows through the first path and the second path based on the input signals presented to the first transistor 204p and a second transistor 204n. In other embodiments, including any embodiment disclosed here, the FET 234 may be a current source, such as but not limited to a FET arranged with an opposing FET set up as a current source or current minor. The tail FET 324 establishes the current that flows in the first path and the second path.

A first supply voltage node 250 supplies a first supply voltage VDDlow to a first collector resistor 240 and the first transistor 204p. A second supply voltage node 254 supplies a second supply voltage VCChigh to a second collector resistor 244. In this embodiment, the first supply voltage VDDlow is lower in magnitude than the second supply voltage VCChigh. In one embodiment the magnitude of VDDlow is 25% of the magnitude of the second supply voltage VCChigh. In one embodiment, the magnitude of VDDlow is 50% of the magnitude of the second supply voltage VCChigh. In one embodiment, the magnitude of VDDlow is 75% of the magnitude of the second supply voltage VCChigh. A system with multiple supply voltage magnitudes may be referred to herein as a split-supply system.

In the embodiment of FIG. 2, the resistance of the first resistor 240 is different than the resistance of the second resistor 244. The combined current through both the first path and the second path is the tail current h which flows through the tail PET 234 to ground 238.

The current through the first path is set by FET 234. The current through the second path is also set by FET 234. The FET 234 has a gate input that received a control voltage. This control voltage controls the voltage swing or change in voltage that is presented to the optical driver.

The current in the differential pair is set by the FET 234 and is defined as the tail current $I_T$. The power $P_1$ expended by the first path is defined as $P_1=VDDlow*I_T/2$. Power $P_2$ expended by the second path is $P_2=VCChigh*I_T/2$. The tail current $I_T$ is divided by two because 50% of the time, on average, the tail current $I_T$ flows through the first path and 50% of the time the tail current $I_T$ flows through the second path. In the prior art, VDDlow and VCChigh were equal and both set to VCChigh, so equal amount of power were expended by both paths. Because the voltage VDDlow at the first supply node 250 is lower than the voltage VCChigh at the second supply node 254, the power $P_1$ dissipated in the first path is lower than the power $P_2$ that is dissipated in the second path. This results in a net power savings as compared to the prior art.

Stated another way, this proposed solution reduces power consumption by supplying the "unused" side of the differential pair, i.e. the first path side which is not connected to the load, with a lower voltage VDDlow. The first path side may be supplied with a lower voltage, as compared to VCChigh, because the first path side does not have the headroom requirements imposed by the external optical device (load) connected to the "used" side (load connected side) of the differential pair. And, the first path is not driving the load. Therefore, approximately half the time, the tail current is switched to the higher supply voltage VCChigh while the other half of the time, the tail current is switched to the lower supply voltage VDDlow. The switching is determined by the Vpre,n and Vpre,p input and may occur millions or billions of times per second (MHz and GHz). When switched to VDDlow, power consumption is reduced due to the VDDlow voltage being lower than VCChigh. Thus, by reducing the voltage drop in the first path, which is not connected to a load, overall power consumption may be reduced.

Figure 1:
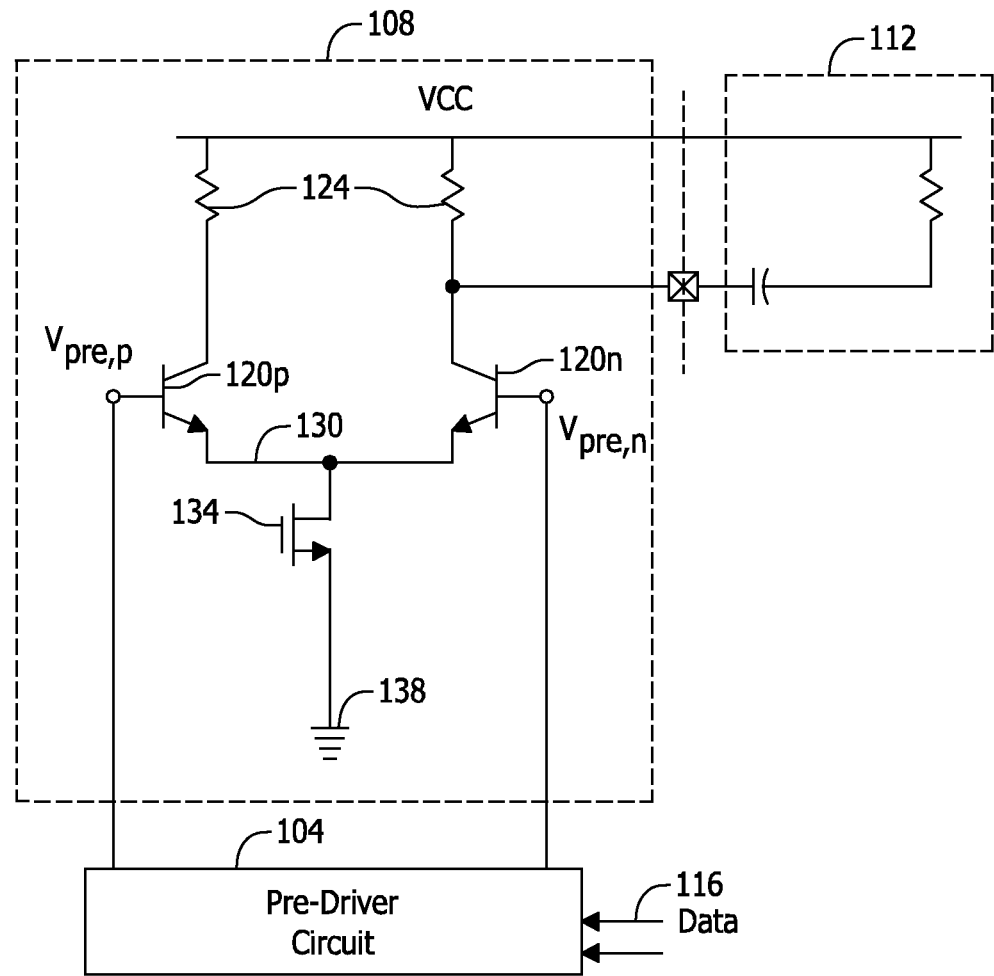
FIG. 1 illustrates an exemplary prior art driver circuit.

When VDDlow magnitude is less than the shared VCC that was presented in the prior art (see FIG. 1), and for generally similar circuit componentry, the result is a net reduction in power consumption. Driver performance is not compromised because the VCChigh is maintained at prior art levels thereby providing sufficient headroom and current sourcing capabilities for the load. Because the load is not connected to the first path, the voltage on node 250 may be reduced without affecting the second path's ability to drive the load.

Numerically, assuming $I_T$ is set to 50 mA and VCChigh is set to 3.3 volts, then the power dissipated in the second path is 50 mA times 3.3 volts equals 165 mW. In the prior art, this is the power dissipated by the first path also, creating a total of 330 mW of power dissipation. However, by setting VDDlow to a lower voltage, such as an exemplary 1.8 volts, the power dissipated in the second path becomes 50 mA times 1.8 volts, which equals 90 mW in the first path. Thus, in this proposed embodiment the total power consumed is 90 mW plus 165 mW which totals 225 mW, which is a reduction of 105 mW. Thus a reduction in power consumption is realized over the prior art.

It is further contemplated that the value of the first resistor 240 is different than the value of the second resistor 244 because it is preferred to maintain the same or similar voltage drop across the transistor 204p. In the first path, the voltage VDDlow is divided across the resistor 240 and the transistor 204p. To maintain a generally similar voltage drop between transistor 204p and 204n, the resistance 240 is adjusted due to the reduced supply voltage 250. Stated another way, the system transistors requires a certain voltage for effective operation. If voltage is provided which is less than an average of Vpre,p and Vpre,n, then Vpre,n may enter saturation, which is unwanted. If VDDlow is set too low, then the voltage drop across transistor 204p is too small. By adjusting the value of the resistor 240, the voltage across transistor 204p may be maintained in view of the reduced supply voltage VDDlow. This is in contrast to the prior art which teaches that the first path and the second path must be balanced and that the resistance in each path (first path and second path) should be the same. The prior art teaches symmetry between the first path and the second path to maintain a uniform voltage drop along each path in the differential pair. Because the supply voltage VDD (FIG. 1) is the same in the prior art, the prior art teaches to maintain the resistors at the same value and maintain an identical voltage drop across each resistor.

Figure 3:
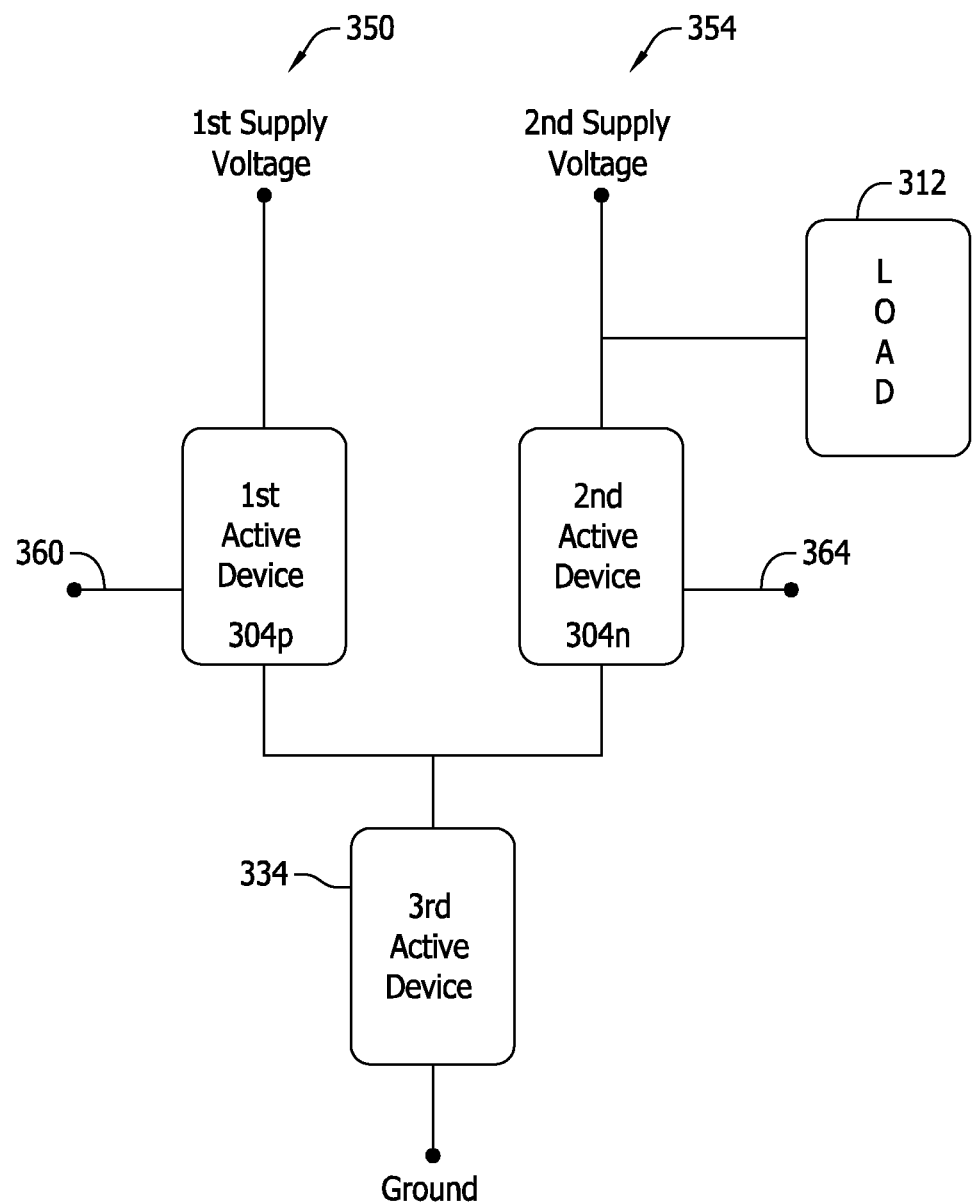
FIG. 3 illustrates a generalized block diagram of a driver system with separate supply voltages.

FIG. 3 illustrates a generalized block diagram of a driver system with separate supply voltages. The specific circuit of FIG. 2 is but one possible arrangement. As shown in the generalized circuit shown in FIG. 3, a first supply voltage 350 connects to a first active device 304p through a first path load 370, which in turn connects to a third active device through a first path. A second supply voltage 354, which is greater than the first supply voltage 350, is also provided. A second active device 304n connects to the second supply voltage 354 through the second path load 374. The first path load 370 and the second path load 374 may comprise any type impedance matching device in any combination, such as one or more resistor, capacitors, inductors, or active devices.

Figure 5:
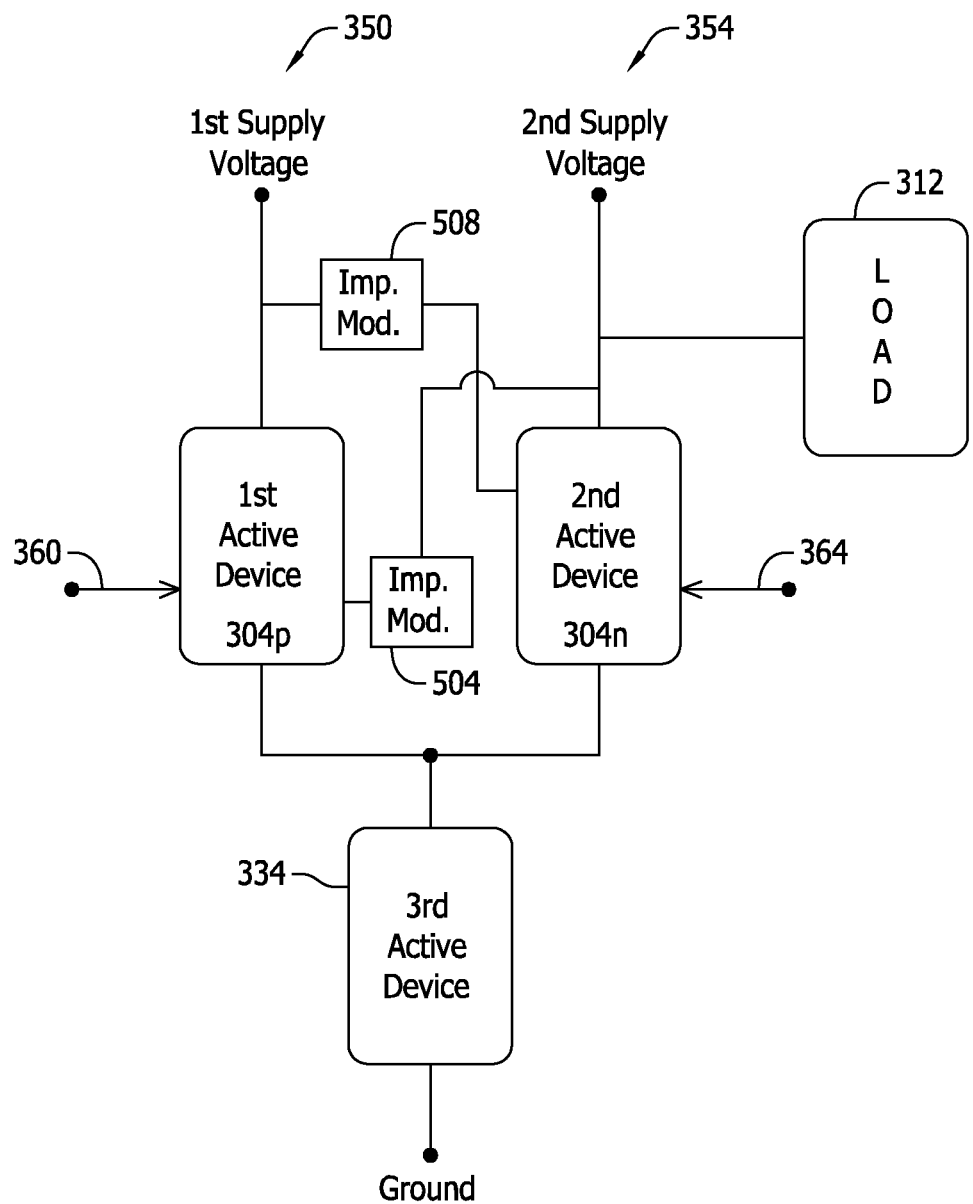
FIG. 5 illustrates a generalized block diagram of a driver system with separate supply voltages and cross-coupled impedance elements.

A load 312 connects to the second path, in this embodiment, between the second supply voltage 354 and the second active device. The load 312 is labeled generally as a load, but may be an external load (external to the integrated circuit) or part of the same integrated circuit. The load 312 may be any type load that is to be driven by the driver. If the term load is used herein, it means the load being driven by the driver, while references to the first path load and second path load are referred to specifically as the first path load and the second path load that are between a voltage supply and an active device as shown in FIGS. 3 and 5.

A third active element 334 connects between a ground node and a common node shared by both the first active device 304p and the second active device 304n. The third active element is in this embodiment is a current source element but could be replaced with a resistance, any current source, or a different configuration or device may be utilized which operates as described herein. Additional elements, which are not shown, may be included in this generalized embodiment. The load 312 may be an optical transmitter, optical signal generator, or any optical device.

Input signals, such as from a pre-driver circuit or other source, are presented to a first device input 360 and second device input 364 as a differential signal. However, because the load is only connected to the second path, associated with the second active element 304n, only the second supply voltage is maintained at a magnitude sufficient to meet the headroom requirements and other power requirements of the load 312. The first supply voltage 350 is reduced in magnitude to realize power savings as compared to embodiments in which a common supply voltage (at the second supply voltage magnitude) feeds both the first active device 304p and the second active device 304n. The basis for the power saving is discussed above in connection with FIG. 2.

Figure 4:
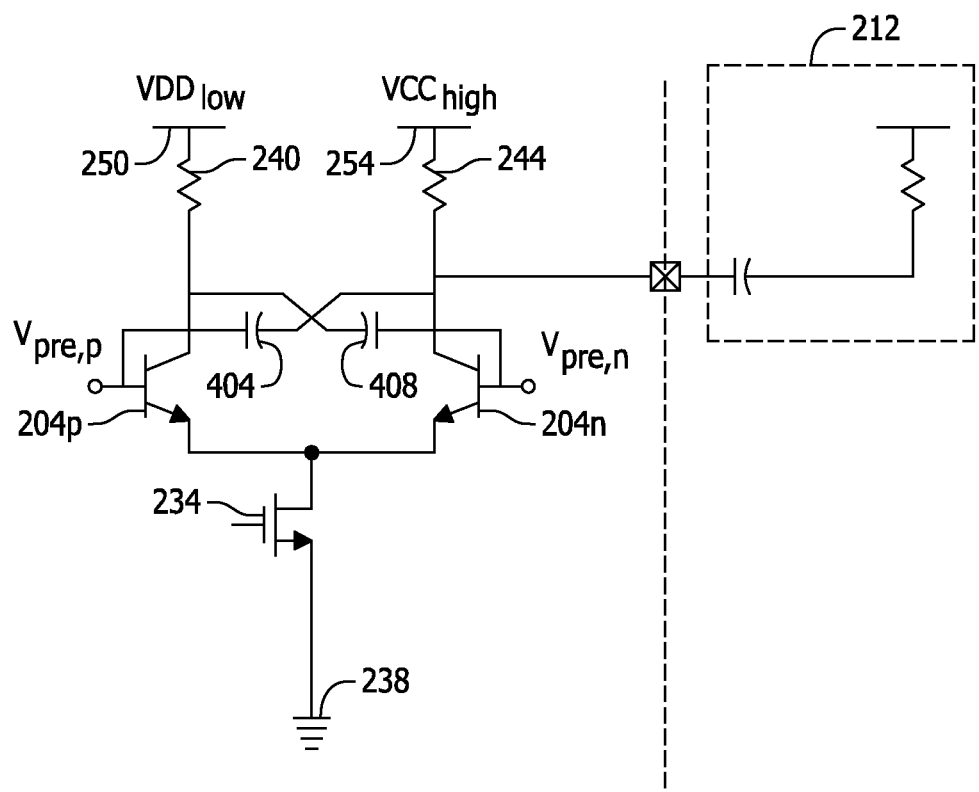
FIG. 4 illustrates a second embodiment of a driver circuit with separate supply voltages and cross-coupled capacitors.

FIG. 4 illustrates a second embodiment of a driver circuit with separate supply voltages and cross-coupled capacitors. While the embodiments of FIGS. 2 and 3 reduce power consumption as compared to the prior art, the first path and the second path are not symmetric as each path has a different supply voltage and resistance (240, 244).

The downside to configuration of FIGS. 2 and 3 is that the load presented to the positive output (first path) of the pre-driver is different than the load presented to the negative side (second path) of the pre-driver. This occurs because the major component of the capacitive load presented to the pre-driver is caused by the Miller amplification of the parasitic capacitance of the input transistors of the final driver stage.

In this configuration, the Miller effect is the amplification of the capacitance connected between the input and output of an amplifying stage. For a differential driver carrying large currents, as is the case for most laser drivers and optical signal transmitters, the transistors in the differential stage must be large in order to handle that current. This large current carrying capacity results in the gain from base (or gate) to collector (or drain) being relatively large. The large transistor size results in the parasitic capacitance from base (or gate) to collector (or drain) also being relatively large. Therefore the effective capacitance dictated by the Miller effect is substantial. The resulting capacitance would affect high frequency operation and limits the driver circuit's ability to operate within specification at high frequency.

For the embodiments shown in FIGS. 2 and 3, which may be referred to as a split-supply configuration since the supply voltages are different and separated, the resistor on the "unused" side must be different than the effective resistance on the "used" side because the headroom requirements are different. Because the gain from base/gate to collector/drain is proportional to the resistance at the collector/drain, the gain will be different for each transistor, namely first path gain is different than second path gain. Because the Miller capacitance is proportional to gain, the effective capacitance to ground presented by either side of the differential paired transistor in the embodiments of FIGS. 2 and 3 will be different. Stated another way, the different supply voltage necessitates a different resistor value and hence gain, which in turn changes the capacitance or input impedance presented to the pre-driver. This creates an asymmetric environment.

This asymmetry between the first path and the second path reduces the quality of the pre-driver signal especially in situations where inductive peaking is used as a bandwidth extension technique as the resonant frequency and damping on either side of the differential pre-driver load may be drastically different.

To address this resulting issue, due to the Miller Effect with the embodiments of FIGS. 2 and 3, technique for bandwidth extension is called "neutralization", "capacitive feedback", or "negative capacitance" is proposed. Negative capacitance has not been used in connection with a split-supply configuration in prior art systems.

To enable negative capacitance, or capacitive feedback, two capacitors are cross-coupled from one input to the opposite output to create a feed-forward effect that can be used to compensate for the Miller effect. It is contemplated that the two capacitors are matched to yield desired results, or unmatched. For the situation described here, the capacitors can be sized asymmetrically (differently) to compensate for the different gain on either side of the differential pair. Although the load may not be perfectly balanced using this technique, it can drastically improve the load matching and, therefore, the signal quality at the final stage input.

FIG. 4 illustrates one possible configuration of a split supply driver with cross coupled capacitors. As compared to FIG. 2, similar elements are identified with identical reference numbers. In this example embodiment, capacitors 404, 408 are cross coupled between the transistors 204p, 204n as shown. In particular, a first capacitor 404 cross connects between the base input of transistor 204p and the output node located between the collector node of the transistor 204n and the resistor 244. The output node is the node to which the load 212 connects to the driver. A second capacitor 408 cross connects between the base input of transistor 204n and the node between the collector node of the IO transistor 204p and the resistor 240. The transistors 204n, 204p connect to FET 234. The FET 234 connects to ground 238 as shown.

In this embodiment, the capacitive value of the first capacitor 404 differs from the capacitive value of the second capacitor 408. As a result, different feedback capacitance is provided to the base node (input) of each transistor 204 to account for the different capacitance and resulting input impedance in the first path and the second path. In one embodiment, the value of each capacitor is selected to equalize the input impedance presented to the pre-driver circuit on the base nodes of each transistor 204p, 204n. As a result of this configuration, the capacitance generated by the Miller Effect or Miller Capacitance is cancelled or equalized by the cross-couple capacitors 404, 408 thereby improving high frequency operation. In other embodiments, the capacitance values may be identical.

FIG. 5 illustrates a generalized block diagram of a driver system with separate supply voltages and cross-coupled impedance elements. As compared to FIG. 3, similar elements are identified with identical reference numbers. As shown, a first impedance modification element 504 connects between the first active device 304p and the load terminal or to a terminal of the second active device 304n. A second impedance modification element 508 connects between the second active device 304n and a terminal between the first path load 370 and the first active device 304p. The impedance modification elements 504, 508 may comprise capacitors, inductors, resistors, one or more active elements, or a combination or network of one or more of these elements. The impedance modification elements 504, 508 are selected to balance the impedance as the inputs 306, 364 to the first and second active devices 304p, 304n. The first path load 370 is provided between the first supply voltage 350 and the first active device 304p. The second path load 374 is provided between the second supply voltage 354 and the second active device 304n.

Although the impedance modifiers 504, 508 are shown as connecting to specific elements, such as the active devices, and specific location in the circuit in relation to the load and VCC, it is contemplated that in another embodiment, the impedance modification elements 504, 508 may connect at different locations, such as the inputs 360, 364 to the active devices. The load may comprise a laser, optical transmitter, or other optical signal generator. Likewise, although shown as a single element, it is contemplated that the impedance modification elements 504, 508 may be multiple elements configured as a network or located at different points. The goal of the impedance matching elements is to adjust the input impedance presented to the pre-driver and to balance the capacitance which is otherwise asymmetric due to the differing resistor values and resulting capacitance in the first path and the second path.

Figure 6A:
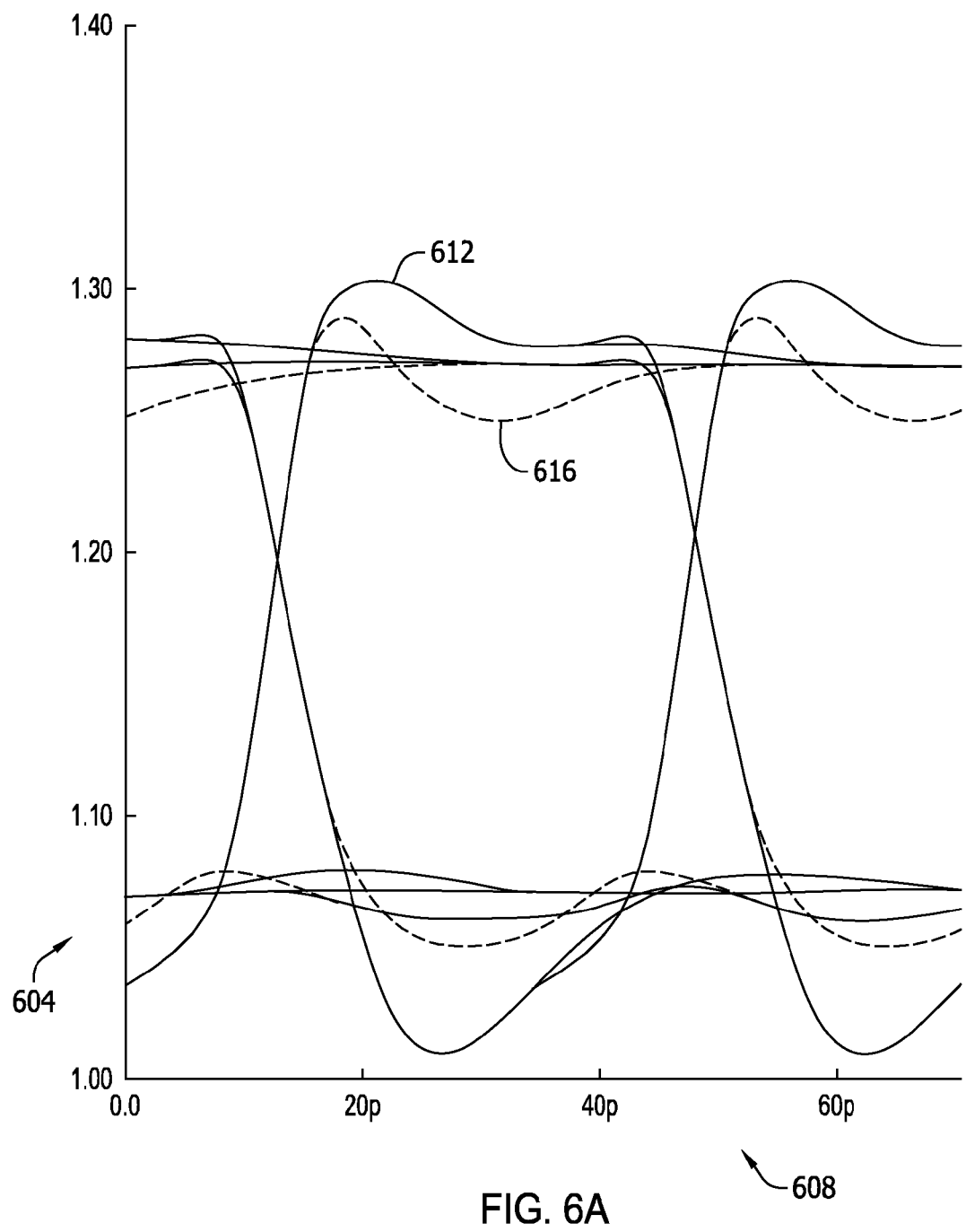
FIG. 6A illustrates an exemplary plot of the pre-driver eye with cross-couple capacitors.

FIG. 6A illustrates an exemplary plot of the pre-driver eye with cross-coupled capacitors. The plot of FIG. 6A includes voltage on the vertical axis 604 and time on the horizontal axis 608. Shown are two signal plots 612, 616 which are imposed on top of each other. The Vpre,p signal 612 represents the pre-driver input signal presented at the base of transistor 204p with cross-coupled capacitors in place. The Vpre,n signal 616 represents the pre-driver input signal presented at the base of transistor 204n with cross-coupled capacitors in place. As can be seen, the eye of these signal plot is generally open and well defined and the slope of the transition between high and low signal values is sufficient to separate transitions. These signal plots are generated with the cross-coupled capacitors in place and, as compared to the plots of FIG. 6B, show improved circuit performance.

Figure 6B:
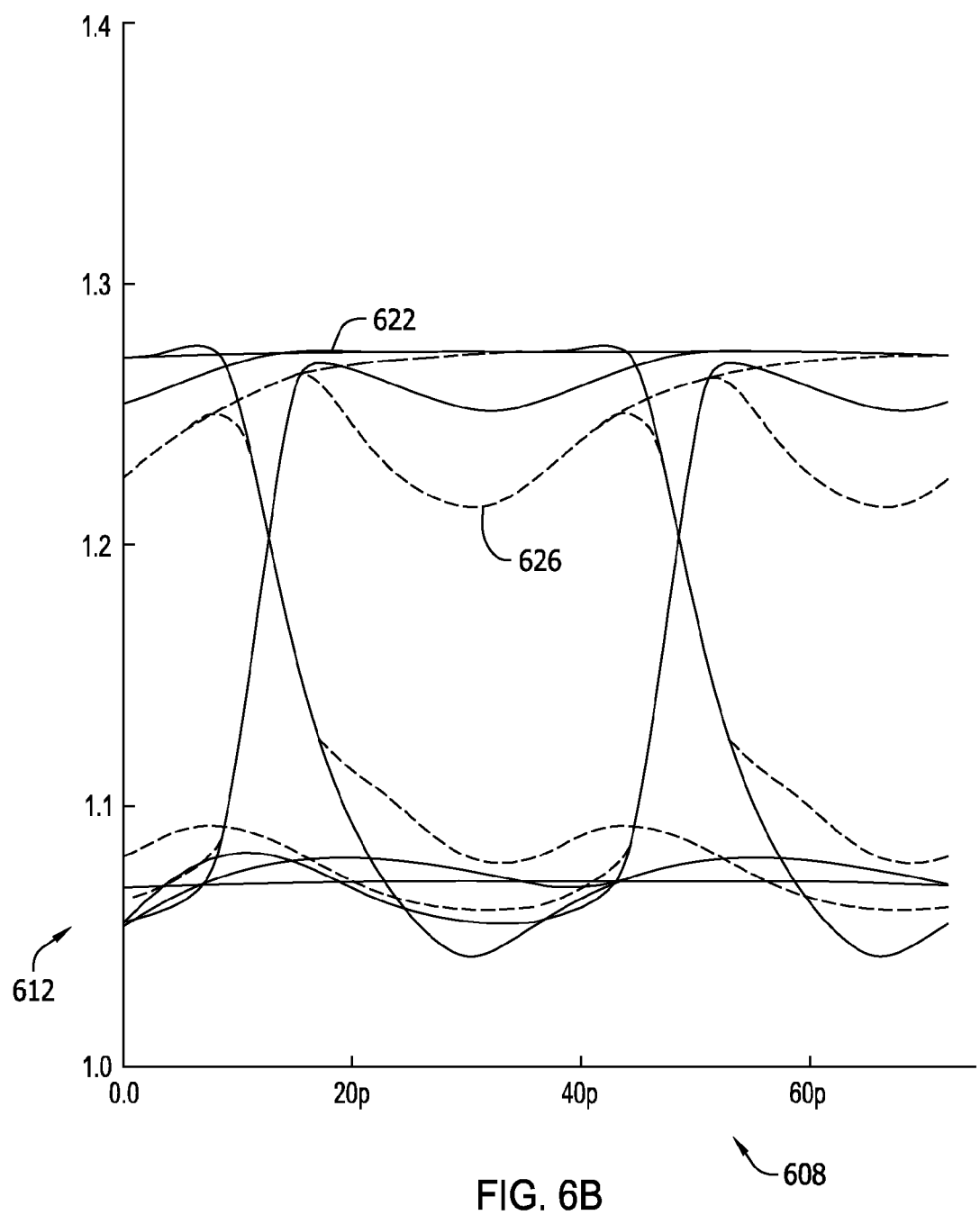
FIG. 6B illustrates an exemplary plot of the pre-driver eye without cross-couple capacitors.

FIG. 6B illustrates an exemplary plot of the pre-driver eye without cross-coupled capacitors. The plot of FIG. 6A includes voltage on the vertical axis 604 and time on the horizontal axis 608. Shown are two signal plots 622, 626 which are imposed on top of each other. The Vpre,p signal 622 represents the pre-driver input signal presented at the base of transistor 204p without cross-coupled capacitors in place. The Vpre,n signal 626 represents the pre-driver input signal presented at the base of transistor 204n without cross-coupled capacitors in place. As can be seen, the eye of these signal plots 622, 626 is less open and the slope of the transition between high and low signal values is not as steep as compared to the plots of FIG. 6A. Consequently, the plots of FIG. 6B do not maintain sufficient separate transitions as compared to the circuit plot of FIG. 6A. These signal plots 622, 626 are generated without the cross-coupled capacitors in place and, as compared to the plots of FIG. 6B, show degraded circuit performance.

Figure 7A:
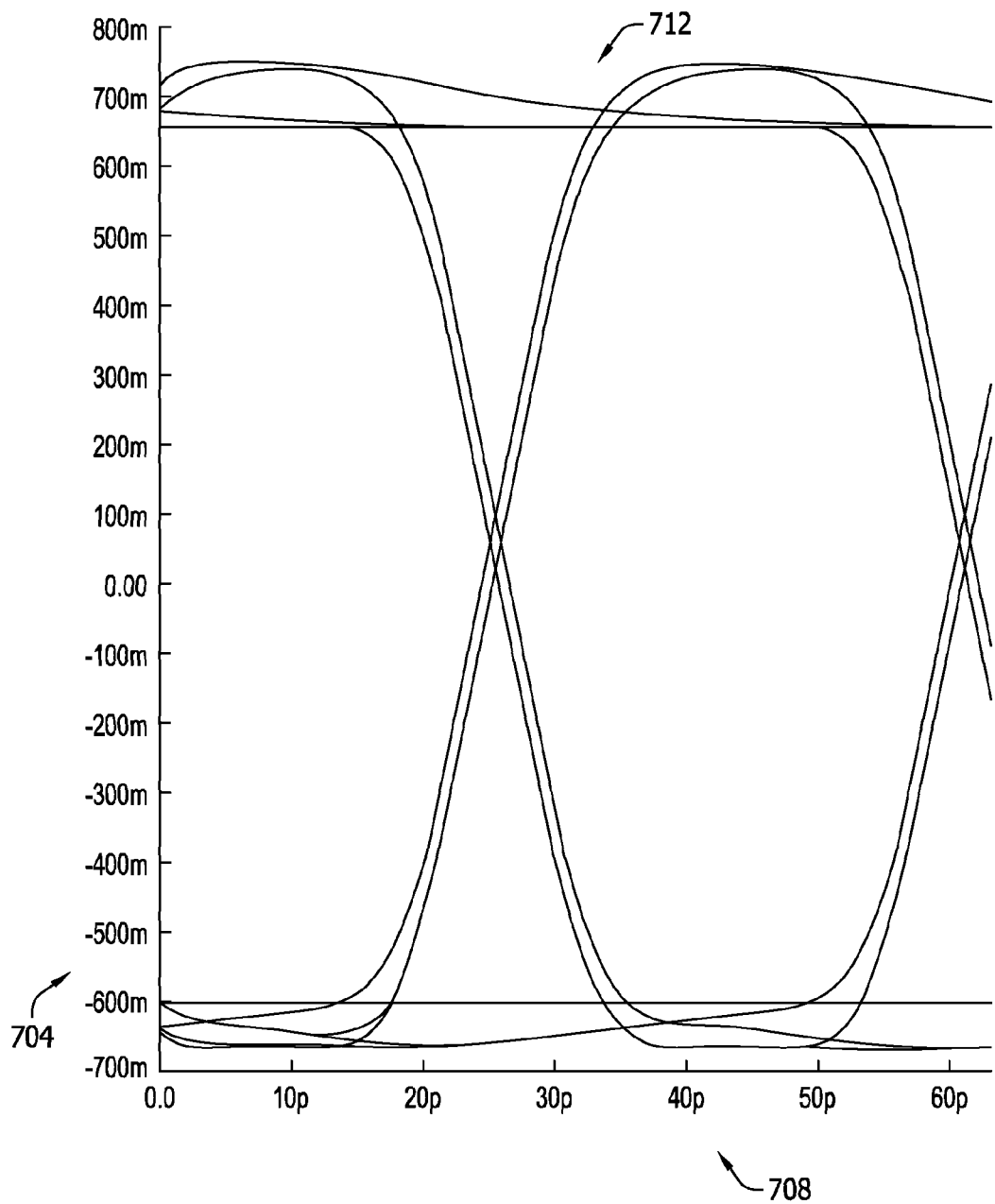
FIG. 7A illustrates an exemplary plot of the driver output eye with cross-couple capacitors.

FIG. 7A illustrates an exemplary plots of the driver output eye with cross-coupled capacitors. The plot of FIG. 7A includes voltage on the vertical axis 704 and time on the horizontal axis 708. In exemplary plot 712 represents the output from the driver with the cross-coupled capacitors in place. Because the driver output is single ended, only one signal plot is shown, as compared to FIG. 6A, 6B, which is a differential signal.

Shown in FIG. 7A, the rise time is 7.84 picoseconds and the fall time is 7.58 picoseconds indicating a good transition speed. Likewise, the eye is generally open and transitions are distinct. These plots are created with the cross-coupled capacitors and, as compared to the plots of FIG. 7B, exhibit improved performance.

Figure 7B:
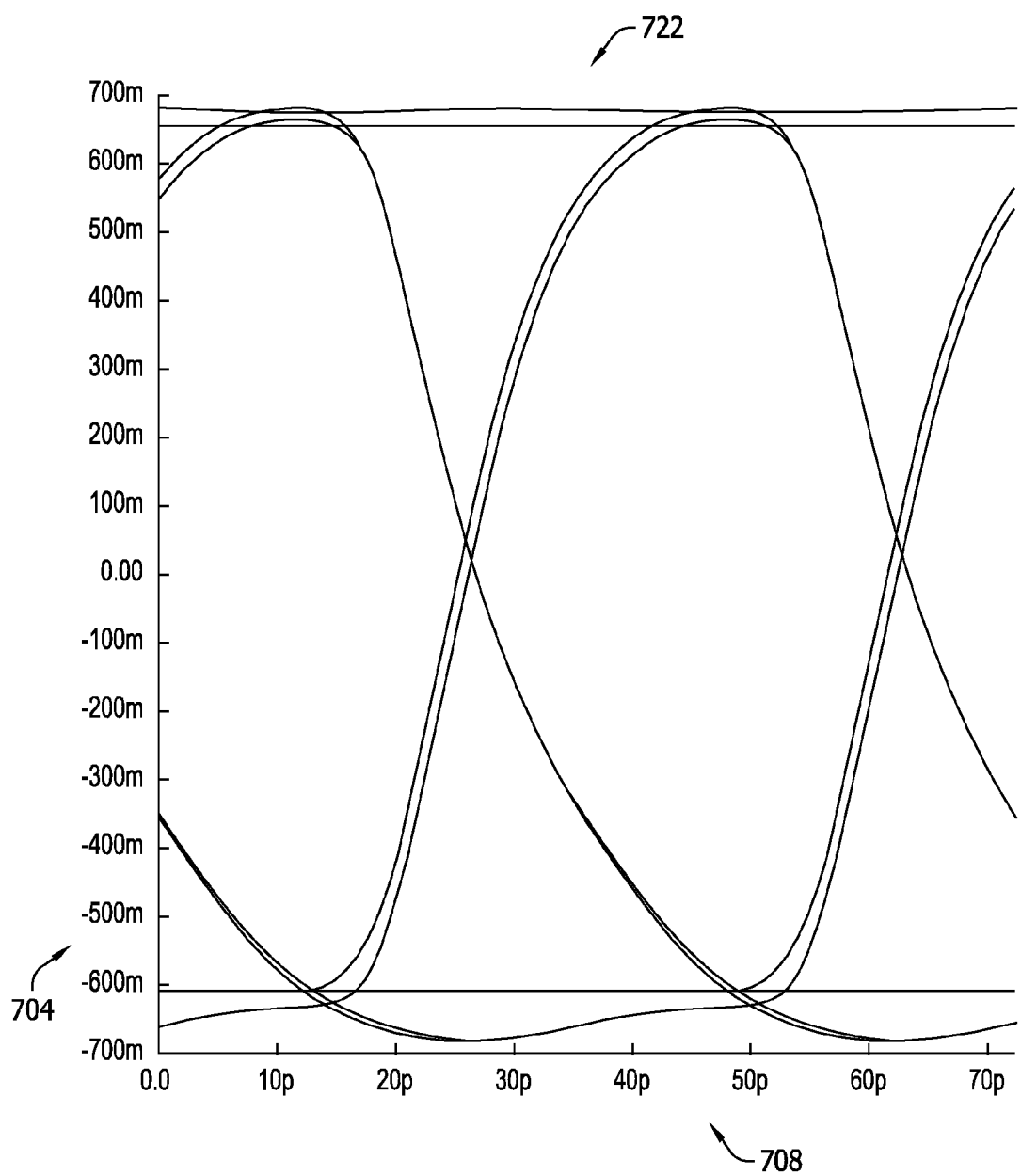
FIG. 7B illustrates an exemplary plot of the driver output eye without cross-couple capacitors.

FIG. 7B illustrates an exemplary plot of the driver output eye without cross-coupled capacitors. The plot of FIG. 7B includes voltage on the vertical axis 704 and time on the horizontal axis 708. In exemplary plot 722 shown in FIG. 7B represents the output from the driver without the cross-coupled capacitors in place. In this plot 722, the rise time is 10.32 picoseconds and the fall time is 14.33 picoseconds indicating a slower transition speed when the cross-coupled capacitors are not present Likewise, the eye is less open, transitions are less distinct, and there is larger rise/fall time asymmetry as compared to the plots of FIG. 7A. As a result, data rate would be reduced, for a given bit error rate (BER).

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. An optical transmitter driver comprising;
   a differential pair configured to drive a load with a drive signal responsive to a first input signal and a second input signal, the differential pair including:
   a first path having a first resistor connected to a first voltage supply and a first transistor, the first transistor having an input configured to receive the first input signal;
   a second path having a second resistor connected to a second voltage supply and a second transistor, the second transistor having an input configured to receive the second input signal, the first input signal and the second input signal defining a differential signal; and
   a load connection node between the second resistor and the second transistor, the load connection node presenting the drive signal to the load, wherein the first voltage supply is less than the second voltage supply resulting in the first path consuming less power than the second path; and
   a first capacitor connected between the first transistor input and the load connection node and a second capacitor connected between the second transistor input and a node established between the first resistor and the first transistor such that the first capacitor has a different capacitance value than the second capacitor.

2. The optical transmitter driver of claim 1, wherein the load comprises an optical transmitter having a single ended input configured to generate an optical signal responsive to the drive signal.

3. The optical transmitter driver of claim 1, further comprising a differential pair tail having an active element, the differential pair tail connected between the first transistor, the second transistor and a ground node.

4. The optical transmitter driver of claim 1, wherein the first voltage supply is equal to or less than 50% of the second voltage supply.

5. The optical transmitter driver of claim 1, wherein a resistance of the first resistor is not equal to a resistance of the second resistor.

6. A driver configured to drive a load with a drive signal, the driver generating the drive signal responsive to a first input signal and a second input signal, the driver including:
   a first active device connected to a first voltage supply node, the first active device having an input configured to receive the first input signal;

a second active device connected to a second voltage supply node, the second active device having an input configured to receive the second input signal, the first input signal and the second input signal defining a differential signal;

a load connection node between the second voltage supply and the second active device, the load connection node presenting the drive signal to the load, wherein a voltage on the first voltage supply node is less than a voltage on the second voltage supply node; and a first impedance matching device connected between the first active device input and the load connection node and a second impedance matching device connected between the second transistor input and the first supply voltage node such that the first impedance matching device has a different value than the second impedance matching device.

7. The driver of claim 6, wherein the first active device and second active device comprise transistors configured as a differential pair.

8. The driver of claim 6, further comprising a first resistor located between the first active device and the first supply voltage node and a second resistor located between the second active device and the second supply voltage node.

9. The driver of claim 6, wherein the first resistor has a different value than the second resistor.

10. The driver of claim 6, further comprising a third active device connected to both of the first active device and the second active device and to ground, the third active device configured as a current tail.

11. A method for reducing power consumption in a driver when driving an optical transmitter comprising:

providing a differential pair having a first path, which includes a first resistor and a first transistor, and a second path, which includes a second resistor and a second transistor;

providing a first supply voltage to the first path;

providing a second supply voltage to the second path, the first supply voltage lower than the second supply voltage thereby reducing power consumption;

providing a first capacitor between a differential pair first input and the second path and connecting a second capacitor between a differential pair second input and the second path;

receiving a differential signal, in the form of a first input signal and a second input signal, at the differential pair first input and the differential pair second input respectively;

amplifying the first input signal and a second input signal with the differential pair to create a singled ended drive signal;

providing feedback between the first path and the second path through the first capacitor and the second capacitor, the first capacitor and the second capacitor having different capacitances; and presenting the drive signal to a load to on a differential pair output node, the differential pair output node located on the second path.

12. The method of claim 11, wherein the load is an optical transmitter.

13. The method of claim 11, wherein the first path has the first resistor connected in series to the first supply voltage and the first transistor and the second path has the second resistor connected in series to the second supply voltage and the second transistor.

14. The method of claim 11, wherein a value of the first resistor is different than a value of the second resistor.

* * * * *